United States Patent
Zhang et al.

(10) Patent No.: US 8,854,754 B2
(45) Date of Patent: Oct. 7, 2014

(54) SYSTEMS AND METHODS FOR LOCAL ITERATION ADJUSTMENT

(75) Inventors: Fan Zhang, Milpitas, CA (US); Zongwang Li, San Jose, CA (US); Wu Chang, Santa Clara, CA (US)

(73) Assignee: LSI Corporation, San Jose, CA (US)

( * ) Notice: Subject to any disclaimer, the term of this patent is extended or adjusted under 35 U.S.C. 154(b) by 452 days.

(21) Appl. No.: 13/213,751

(22) Filed: Aug. 19, 2011

(65) Prior Publication Data
US 2013/0046958 A1  Feb. 21, 2013

(51) Int. Cl.
- *G11B 5/09* (2006.01)
- *G11B 20/10* (2006.01)
- *G06F 9/30* (2006.01)

(52) U.S. Cl.
CPC .................... *G06F 9/30* (2013.01)
USPC .......................................................... 360/39

(58) Field of Classification Search
None
See application file for complete search history.

(56) References Cited

U.S. PATENT DOCUMENTS

| | | | |
|---|---|---|---|
| 5,278,703 A | 1/1994 | Rub | |
| 5,278,846 A | 1/1994 | Okayama et al. | |
| 5,317,472 A | 5/1994 | Schweitzer, III | |
| 5,325,402 A | 6/1994 | Ushirokawa | |
| 5,392,299 A | 2/1995 | Rhines et al. | |
| 5,471,500 A | 11/1995 | Blaker et al. | |
| 5,513,192 A | 4/1996 | Janku et al. | |
| 5,523,903 A | 6/1996 | Hetzler | |
| 5,550,870 A | 8/1996 | Blaker et al. | |
| 5,612,964 A | 3/1997 | Haraszti | |
| 5,701,314 A | 12/1997 | Armstrong et al. | |
| 5,710,784 A | 1/1998 | Kindred et al. | |
| 5,712,861 A | 1/1998 | Inoue et al. | |
| 5,717,706 A | 2/1998 | Ikeda | |
| 5,768,044 A | 6/1998 | Hetzler | |
| 5,802,118 A | 9/1998 | Bliss et al. | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Daniell L Negron
(74) *Attorney, Agent, or Firm* — Hamilton DeSanctis & Cha

(57) ABSTRACT

Various embodiments of the present invention provide systems and methods for data processing. As an example, a data processing circuit is disclosed that includes: a data decoder circuit and a local iteration adjustment circuit. The data decoder circuit is operable to perform a number of local iterations on a decoder input to yield a data output. The local iteration adjustment circuit is operable to generate a limit on the number of local iterations performed by the data decoder circuit.

20 Claims, 6 Drawing Sheets

(56) References Cited

U.S. PATENT DOCUMENTS

| | | |
|---|---|---|
| 6,065,149 A | 5/2000 | Yamanaka |
| 6,097,764 A | 8/2000 | McCallister et al. |
| 6,145,110 A | 11/2000 | Khayrallah |
| 6,216,249 B1 | 4/2001 | Bliss et al. |
| 6,216,251 B1 | 4/2001 | McGinn |
| 6,229,467 B1 | 5/2001 | Eklund et al. |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,381,726 B1 | 4/2002 | Weng |
| 6,438,717 B1 | 8/2002 | Butler et al. |
| 6,473,878 B1 | 10/2002 | Wei |
| 6,476,989 B1 | 11/2002 | Chainer et al. |
| 6,625,775 B1 | 9/2003 | Kim |
| 6,657,803 B1 | 12/2003 | Ling et al. |
| 6,671,404 B1 | 12/2003 | Kawatani et al. |
| 6,748,034 B2 | 6/2004 | Hattori et al. |
| 6,757,862 B1 | 6/2004 | Marianetti, II |
| 6,785,863 B2 | 8/2004 | Blankenship et al. |
| 6,788,654 B1 | 9/2004 | Hashimoto et al. |
| 6,810,502 B2 | 10/2004 | Eidson |
| 6,980,382 B2 | 12/2005 | Hirano et al. |
| 6,986,098 B2 | 1/2006 | Poeppelman et al. |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greeberg et al. |
| 7,093,179 B2 | 8/2006 | Shea |
| 7,113,356 B1 | 9/2006 | Wu |
| 7,136,244 B1 | 11/2006 | Rothber |
| 7,173,783 B1 | 2/2007 | McEwen et al. |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,236,757 B2 | 6/2007 | Raghavan et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,403,752 B2 | 7/2008 | Raghavan et al. |
| 7,430,256 B2 | 9/2008 | Zhidkov |
| 7,502,189 B2 | 3/2009 | Sawaguchi et al. |
| 7,505,537 B1 | 3/2009 | Sutardja |
| 7,509,927 B2 | 3/2009 | Mukomilow |
| 7,523,375 B2 | 4/2009 | Spencer |
| 7,587,657 B2 | 9/2009 | Haratsch |
| 7,590,168 B2 | 9/2009 | Raghaven et al. |
| 7,702,989 B2 | 4/2010 | Graef et al. |
| 7,712,008 B2 | 5/2010 | Song et al. |
| 7,738,201 B2 | 6/2010 | Jin et al. |
| 7,752,523 B1 | 7/2010 | Chaichanavong |
| 7,801,200 B2 | 9/2010 | Tan |
| 7,802,163 B2 | 9/2010 | Tan |
| 2003/0063405 A1 | 4/2003 | Jin et al. |
| 2003/0081693 A1 | 5/2003 | Raghavan et al. |
| 2003/0087634 A1 | 5/2003 | Raghavan et al. |
| 2003/0112896 A1 | 6/2003 | Raghavan et al. |
| 2003/0134607 A1 | 7/2003 | Raghavan et al. |
| 2004/0071206 A1 | 4/2004 | Takatsu |
| 2004/0098659 A1 | 5/2004 | Bjerke et al. |
| 2005/0010855 A1 | 1/2005 | Lusky |
| 2005/0078399 A1 | 4/2005 | Fung |
| 2005/0111540 A1 | 5/2005 | Modrie et al. |
| 2005/0157780 A1 | 7/2005 | Werner et al. |
| 2005/0195749 A1 | 9/2005 | Elmasry et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0123285 A1 | 6/2006 | De Araujo et al. |
| 2006/0140311 A1 | 6/2006 | Ashley et al. |
| 2006/0168493 A1 | 7/2006 | Song et al. |
| 2006/0195772 A1 | 8/2006 | Graef et al. |
| 2006/0210002 A1 | 9/2006 | Yang et al. |
| 2006/0248435 A1 | 11/2006 | Haratsch |
| 2006/0256670 A1 | 11/2006 | Park et al. |
| 2007/0011569 A1 | 1/2007 | Vila Casado et al. |
| 2007/0047121 A1 | 3/2007 | Eleftheriou et al. |
| 2007/0047635 A1 | 3/2007 | Stojanovic et al. |
| 2007/0110200 A1 | 5/2007 | Mergen et al. |
| 2007/0230407 A1 | 10/2007 | Petrie et al. |
| 2007/0286270 A1 | 12/2007 | Huang et al. |
| 2008/0049825 A1 | 2/2008 | Chen et al. |
| 2008/0055122 A1 | 3/2008 | Tan |
| 2008/0065970 A1 | 3/2008 | Tan |
| 2008/0069373 A1 | 3/2008 | Jiang et al. |
| 2008/0168330 A1 | 7/2008 | Graef et al. |
| 2008/0276156 A1 | 11/2008 | Gunnam et al. |
| 2008/0301521 A1 | 12/2008 | Gunnam et al. |
| 2009/0185643 A1 | 7/2009 | Fitzpatrick |
| 2009/0199071 A1 | 8/2009 | Graef |
| 2009/0235116 A1 | 9/2009 | Tan et al. |
| 2009/0235146 A1 | 9/2009 | Tan et al. |
| 2009/0259915 A1 | 10/2009 | Livshitz et al. |
| 2009/0273492 A1 | 11/2009 | Yang et al. |
| 2009/0274247 A1 | 11/2009 | Galbraith et al. |
| 2010/0002795 A1 | 1/2010 | Raghavan et al. |
| 2010/0042877 A1 | 2/2010 | Tan |
| 2010/0042890 A1 | 2/2010 | Gunam |
| 2010/0050043 A1 | 2/2010 | Savin |
| 2010/0061492 A1 | 3/2010 | Noeldner |
| 2010/0070837 A1 | 3/2010 | Xu et al. |
| 2010/0164764 A1 | 7/2010 | Nayak |
| 2010/0185914 A1 | 7/2010 | Tan et al. |
| 2011/0075569 A1 | 3/2011 | Marrow et al. |
| 2011/0080211 A1 | 4/2011 | Yang et al. |
| 2011/0087933 A1* | 4/2011 | Varnica et al. ............ 714/704 |
| 2011/0167246 A1 | 7/2011 | Yang et al. |
| 2011/0264979 A1* | 10/2011 | Gunnam et al. ............ 714/752 |
| 2012/0005551 A1* | 1/2012 | Gunnam ............ 714/752 |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.
U.S. Appl. No. 13/167,775, filed Jun. 24, 2011, Li, Zongwang.

(56) References Cited

OTHER PUBLICATIONS

U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. On Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR LOCAL ITERATION ADJUSTMENT

BACKGROUND OF THE INVENTION

The present invention is related to systems and methods for characterizing circuit operation, and more particularly to systems and methods for modifying a data decoding process.

Data processing circuits often include a data detector circuit and a data decoder circuit. In some cases many passes are made through both the data detector circuit and the data decoder circuit in an attempt to recover originally written data. Each pass through both data detector circuit and the data decoder circuit may include a number of iterations through the data decoder circuit. The number of iterations through data decoder circuit is typically fixed resulting at times in less than optimal data processing and power usage.

Hence, for at least the aforementioned reasons, there exists a need in the art for advanced systems and methods for data processing.

BRIEF SUMMARY OF THE INVENTION

The present invention is related to systems and methods for characterizing circuit operation, and more particularly to systems and methods for modifying a data decoding process.

Various embodiments of the present invention provide data processing circuits that include: a data decoder circuit and a local iteration adjustment circuit. The data decoder circuit is operable to perform a number of local iterations on a decoder input to yield a data output. The local iteration adjustment circuit is operable to generate a limit on the number of local iterations performed by the data decoder circuit. In some cases, the data processing circuit includes an equalizer circuit operable to receive a series of digital samples and to equalize the series of digital samples to yield the received input, and an analog to digital converter circuit operable to convert an analog input into the series of digital samples. In some cases, the data detector circuit may be, but is not limited to, a maximum a posteriori data detector circuit or a Viterbi algorithm data detector circuit. In some cases, the data decoder circuit may be, but is not limited to, a Reed Solomon data decoder circuit or a low density parity check decoder circuit.

In some instances of the aforementioned embodiments, the data processing circuit further includes a data detector circuit that is operable to apply a data detection algorithm to a received input to yield the decoder input. In such cases, processing through both the data detector circuit and the data decoder circuit is a global iteration. In some such cases, the data detector circuit and the data decoder circuit are operable to apply a first global iteration the received input, and a second global iteration to the received input. In such cases, the limit on the number of local iterations performed by the data decoder circuit is a first limit corresponding to the first global iteration, and the local iteration adjustment circuit is further operable to generate a second limit on the number of local iterations performed by the data decoder circuit corresponding to the second global iteration. In various cases, the local iteration adjustment circuit is further operable to: receive a first status signal from the data decoder circuit indicating a first number of unsatisfied checks remaining at the end of a first local iteration during the first global iteration; receive a second status signal from the data decoder circuit indicating a second number of unsatisfied checks remaining at the end of a second local iteration during the first global iteration; incorporate the first number of unsatisfied checks in a first average of unsatisfied checks corresponding to the first local iteration during the first global iteration; and incorporate the second number of unsatisfied checks in a second average of unsatisfied checks corresponding to the second local iteration during the first global iteration. In some such cases, the local iteration adjustment circuit is further operable to determine that the second average of unsatisfied checks is less than the first average of unsatisfied checks. Based at least in part on determining that the second average of unsatisfied checks is less than the first average of unsatisfied checks, the local iteration corresponding to the second local iteration is selected as the limit on the number of local iterations during the first global iteration.

In some cases, the local iteration adjustment circuit is further operable to: receive a third status signal from the data decoder circuit indicating a third number of unsatisfied checks remaining at the end of a third local iteration during the second global iteration; receive a fourth status signal from the data decoder circuit indicating a fourth number of unsatisfied checks remaining at the end of a fourth local iteration during the second global iteration; incorporate the third number of unsatisfied checks in a third average of unsatisfied checks corresponding to the third local iteration during the second global iteration; incorporate the fourth number of unsatisfied checks in a fourth average of unsatisfied checks corresponding to the fourth local iteration during the second global iteration; and determine that the fourth average of unsatisfied checks is less than the third average of unsatisfied checks. Based at least in part on determining that the fourth average of unsatisfied checks is less than the third average of unsatisfied checks, the local iteration corresponding to the fourth local iteration is as the limit on the number of local iterations during the second global iteration.

Other embodiments of the present invention provide methods that include: receiving a data input, applying a data detection algorithm to the data input to yield a detected output, and applying a data decoding algorithm to the detected output to yield a decoded output. Applying both the data detection algorithm and the data decoding algorithm is a global iteration. The data decoding algorithm is applied multiple times during each global iteration with each application of the decoding algorithm being a local iteration. The method further includes: determining a first number of unsatisfied checks remaining at the end of a first local iteration; determining a second number of unsatisfied checks remaining at the end of a second local iteration; incorporating the first number of unsatisfied checks in a first average of unsatisfied checks corresponding to the first local iteration; incorporating the second number of unsatisfied checks in a second average of unsatisfied checks corresponding to the second local iteration; determining that the second average of unsatisfied checks is less than the first average of unsatisfied checks; and based at least in part on determining that the second average of unsatisfied checks is less than the first average of unsatisfied checks, selecting the local iteration corresponding to the second local iteration as the limit on the number of local iterations.

In some instances of the aforementioned embodiment, the first local iteration and the second local iteration occur during a first global iteration. In such instances, the method may further include: limiting the number of local iterations during subsequent first global iterations to the limit on the number of local iterations; determining a third number of unsatisfied checks remaining at the end of a third local iteration during a second global iteration; determining a fourth number of unsatisfied checks remaining at the end of a fourth local iteration during a second global iteration; incorporating the third number of unsatisfied checks in a third average of unsatisfied checks corresponding to the third local iteration; incorporating the fourth number of unsatisfied checks in a fourth average of unsatisfied checks corresponding to the fourth local iteration; determining that the fourth average of unsatisfied checks is less than the third average of unsatisfied checks; and based at least in part on determining that the fourth average of unsatisfied checks is less than the third average of unsatisfied checks, selecting the local iteration corresponding to the fourth local iteration as the limit on the number of local iterations during subsequent second global iterations.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for characterizing circuit operation, and more particularly to systems and methods for modifying a data decoding process.

Various embodiments of the present invention provide for modifying the number of local iterations in a data decoder of a data processing circuit. In some cases, the number of iterations is adaptively selected based upon previous processing results. In some embodiments of the present invention, the data processing circuit includes a data detector circuit and the data decoder circuit. The output of the data detector feeds the data decoder, and processing through both the data detector circuit and the data decoder circuit is referred to herein as a "global iteration". The data decoder circuit is capable or performing one or more iterations through the decoder circuit during each global iteration. Each of these iterations through the data decoder circuit are referred to herein as "local iterations". In one particular embodiment of the present invention, a default of ten local iterations is performed. Upon adjusting the number of local iterations, the number of local iterations associated with a first global iteration may be different than a number of local iterations associated with a second global iteration.

Figure 1:
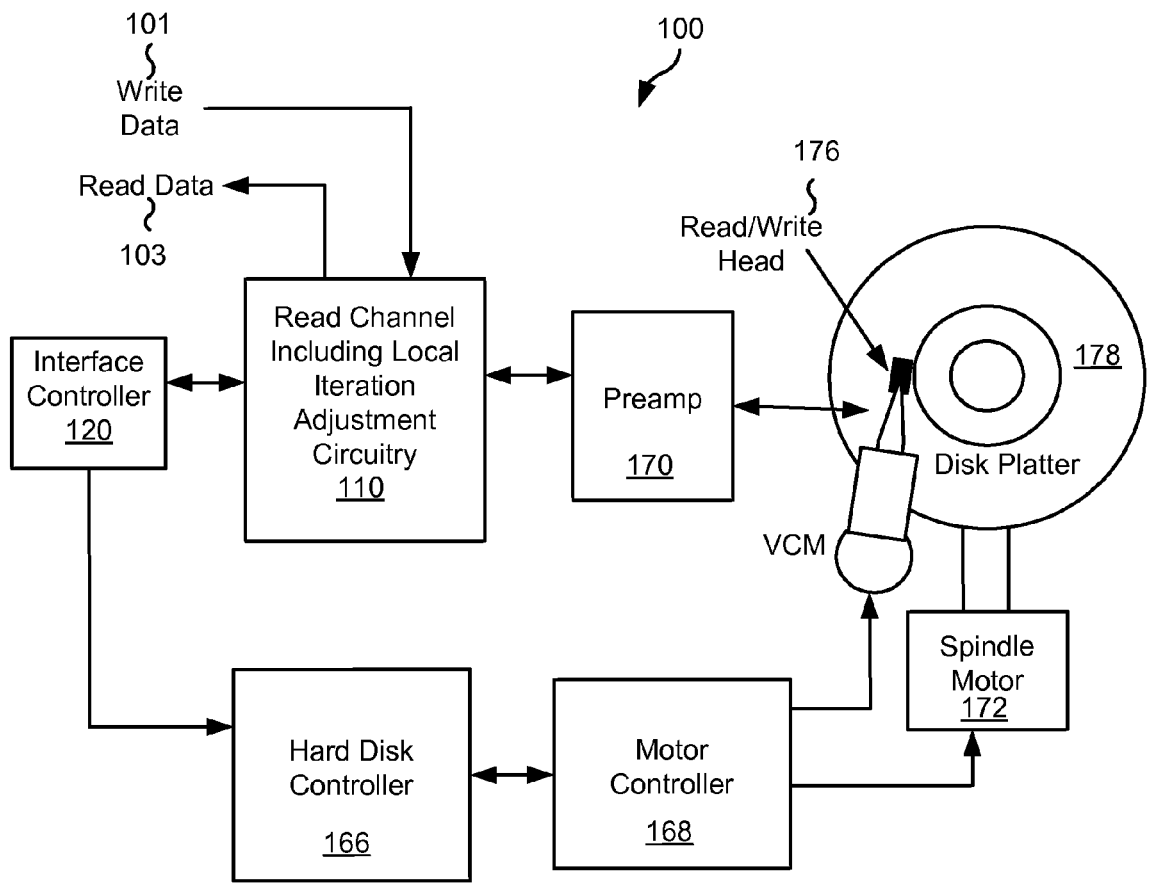
FIG. 1 shows a storage device including a read channel having local iteration adjustment circuitry in accordance with one or more embodiments of the present invention.

Turning to FIG. 1, a storage system 100 including a read channel circuit 110 with noise injection circuitry is shown in accordance with some embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

During one or more set up periods or in parallel to standard read operations, the local iteration adjustment circuitry modifies the number of local iterations allowed in a data decoder circuit included as part of read channel circuit 110. Such local iteration adjustment may be done using circuitry similar to that discussed below in relation to FIG. 3 or FIG. 4, and/or may operate similar to the processes discussed below in relation to FIGS. 5a-5b and/or FIG. 6.

It should be noted that storage system 100 may be integrated into a larger storage system such as, for example, a RAID (redundant array of inexpensive disks or redundant array of independent disks) based storage system. It should also be noted that various functions or blocks of storage system 100 may be implemented in either software or firmware, while other functions or blocks are implemented in hardware.

Figure 2:
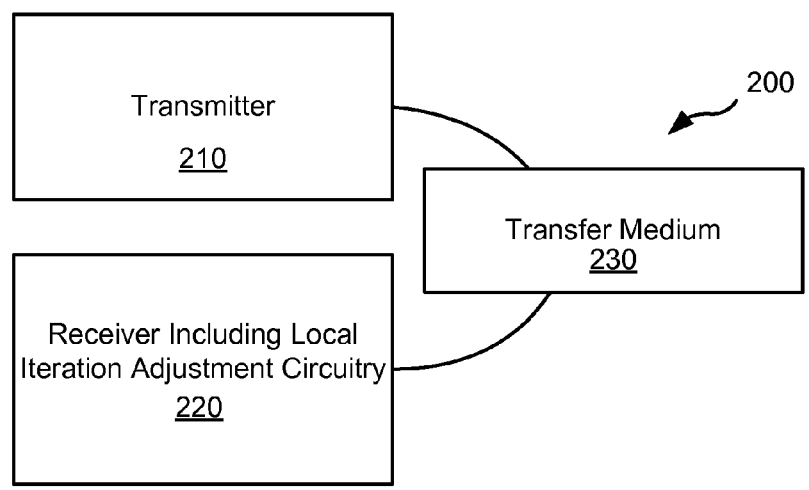
FIG. 2 shows a data transmission device including a receiver having local iteration adjustment circuitry in accordance with some embodiments of the present invention.

Turning to FIG. 2, a data transmission device 200 including a receiver 220 having local iteration adjustment circuitry is shown in accordance with some embodiments of the present invention. Data transmission system 200 includes a transmitter 210 that is operable to transmit encoded information via a transfer medium 230 as is known in the art. The encoded data is received from transfer medium 230 by receiver 220. Receiver 220 incorporates local iteration adjustment circuitry that may be implemented similar to that discussed below in relation to FIG. 3 or FIG. 4, and/or may operate similar to the processes discussed below in relation to FIGS. 5a-5b and/or FIG. 6.

Figure 3:
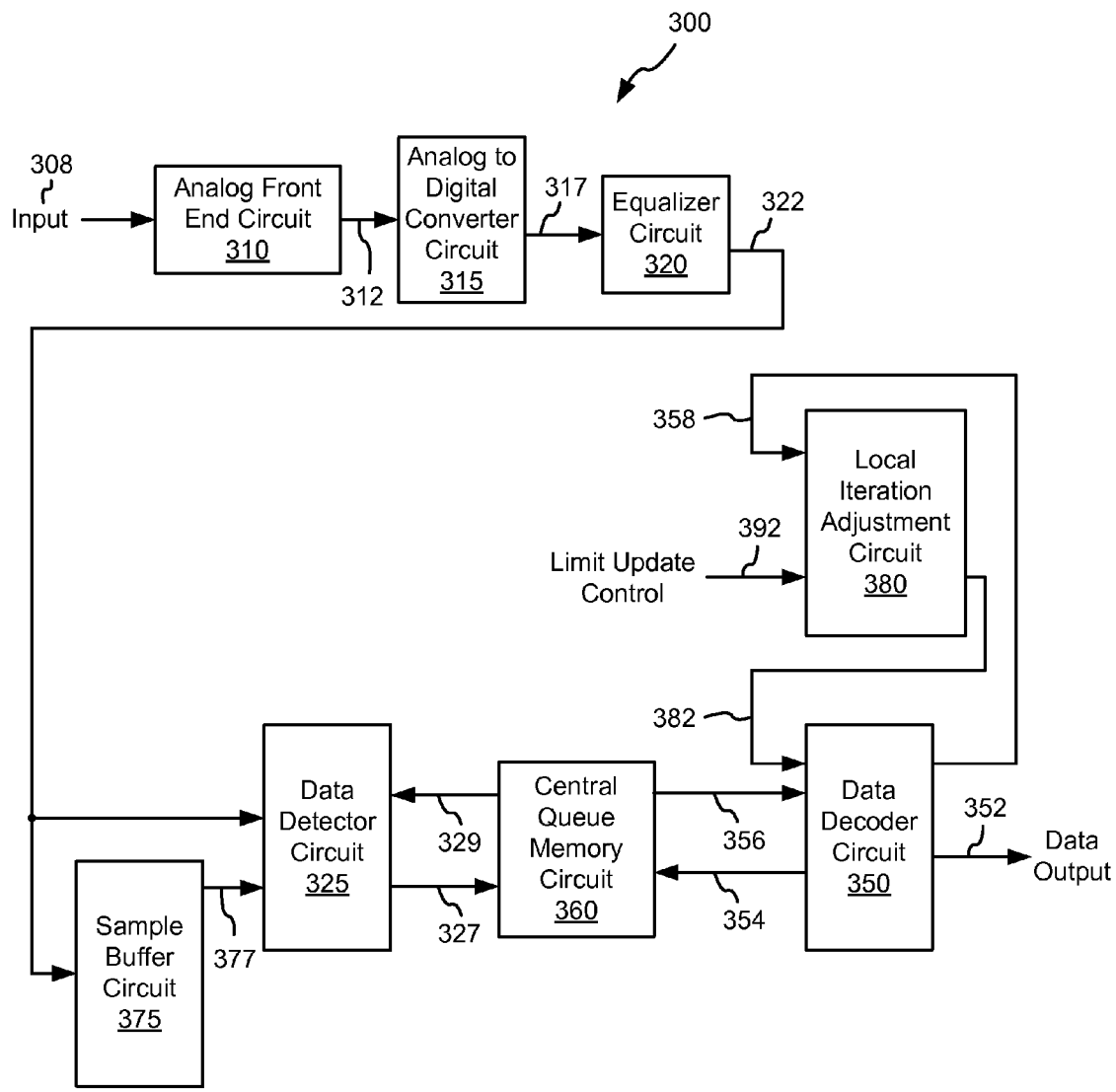
FIG. 3 depicts a data processing circuit having a local iteration adjustment circuit in accordance with some embodiments of the present invention.

Turning to FIG. 3, a data processing circuit 300 is shown that includes a local iteration adjustment circuit 380 in accordance with some embodiments of the present invention. Data processing circuit 300 includes an analog front end circuit 310 that receives an analog signal 308. Analog front end circuit 310 processes analog signal 308 and provides a processed analog signal 312 to an analog to digital converter circuit 315. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 308 is derived from a read/write head assembly (not shown) that is disposed in relation to a storage medium (not shown). In other cases, analog signal 308 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 308 may be derived.

Analog to digital converter circuit 315 converts processed analog signal 312 into a corresponding series of digital samples 317. Analog to digital converter circuit 315 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 317 are provided to an equalizer circuit 320. Equalizer circuit 320 applies an equalization algorithm to digital samples 317 to yield an equalized output 322. In some embodiments of the present invention, equalizer circuit 320 is a digital finite impulse response filter circuit as are known in the art.

Equalized output 322 is provided to both a data detector circuit 325 and to a sample buffer circuit 375. Sample buffer circuit 375 stores equalized output 322 as buffered data 377 for use in subsequent iterations through data detector circuit 325. Data detector circuit 325 may be any data detector circuit known in the art that is capable of producing a detected output 327. As some examples, data detector circuit 325 may be, but is not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention. Detected output 325 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 327 is provided to a central queue memory circuit 360 that operates to buffer data passed between data detector circuit 325 and data decoder circuit 350. When data decoder circuit 350 is available, data decoder circuit 350 receives detected output 327 from central queue memory 360 as a decoder input 356. Data decoder circuit 350 applies a data decoding algorithm to decoder input 356 output 312 in an attempt to recover originally written data. The result of the data decoding algorithm is provided as a decoded output 354. Similar to detected output 327, decoded output 354 may include both hard decisions and soft decisions. For example, data decoder circuit 350 may be any data decoder circuit known in the art that is capable of applying a decoding algorithm to a received input. Data decoder circuit 350 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, data decoder circuit 350 provides the result of the data decoding algorithm as a data output 352.

One or more iterations through the combination of data detector circuit 325 and data decoder circuit 350 may be made in an effort to converge on the originally written data set. As mentioned above, processing through both the data detector circuit and the data decoder circuit is referred to as a "global iteration". For the first global iteration, data detector circuit 325 applies the data detection algorithm without guidance from a decoded output. For subsequent global iterations, data detector circuit 325 applies the data detection algorithm to buffered data 377 as guided by decoded output 354. Decoded output 354 is received from central queue memory 360 as a detector input 329.

During each global iteration it is possible for data decoder circuit 350 to make one or more local iterations including application of the data decoding algorithm to decoder input 356. For the first local iteration, data decoder circuit 350 applies the data decoder algorithm without guidance from decoded output 354. For subsequent local iterations, data decoder circuit 350 applies the data decoding algorithm to decoder input 356 as guided by a previous decoded output 354. The number of local iterations allowed is controlled by local iteration adjustment circuit 380. In some embodiments of the present invention, a default of ten local iterations is allowed for each global iteration. This default number of local iterations may be changed by local iteration adjustment circuit 380 based upon information from previous data processing in an attempt to improve the ability for the data decoding algorithm to converge and/or for power saving purposes.

In particular, when a limit update control input 392 is asserted, local iteration limit circuit 380 initially sets the allowable number of local iterations to the default number (e.g., ten). Limit update control input 392 may be asserted by a user programmable input. In other cases, limit update control input 392 may be asserted based upon a degradation in operation of data processing circuit 300. Based upon the disclosure provided herein, one of ordinary skill in the art will recognize a variety of approaches that may be used to determine when to assert limit update control input 392. Where limit update control input 392 is not asserted, the local iteration limits set during previous monitoring are used.

At completion of each local iteration, data decoder circuit 350 reports the number of remaining unsatisfied checks as a status output 358 to local iteration adjustment circuit 380. Local iteration adjustment circuit 380 monitors the number of unsatisfied checks remaining at the end of each local iteration occurring during the first global iteration through data decoder circuit 350. This monitoring is performed over a large number of data sets. In some embodiments, the monitoring continues for several thousand sectors of data. Local iteration adjustment circuit 380 maintains a running average of the number of unsatisfied checks remaining at the end of each local iteration across the large number of data sets that are processed through data processing circuit 300. Thus, for example, where the default number of local iterations is ten, local iteration adjustment circuit 380 maintains: (a) a first running average of unsatisfied checks remaining after completion of the first local iteration through data decoder circuit 350, (b) a second running average of unsatisfied checks remaining after completion of the second local iteration through data decoder circuit 350, (c) a third running average of unsatisfied checks remaining after completion of the third local iteration through data decoder circuit 350, (d) a fourth running average of unsatisfied checks remaining after completion of the fourth local iteration through data decoder circuit 350, (e) a fifth running average of unsatisfied checks remaining after completion of the fifth local iteration through data decoder circuit 350, (f) a sixth running average of unsatisfied checks remaining after completion of the sixth local iteration through data decoder circuit 350, (g) a seventh running average of unsatisfied checks remaining after completion of the seventh local iteration through data decoder circuit 350, (h) an eighth running average of unsatisfied checks remaining after completion of the eighth local iteration through data decoder circuit 350, (i) a ninth running average of unsatisfied checks remaining after completion of the ninth local iteration through data decoder circuit 350, and (j) a tenth running average of unsatisfied checks remaining after completion of the tenth local iteration through data decoder circuit 350. Once a sufficient number of data sets have been processed through data processing circuit 300, local iteration adjustment circuit 380 determines which of the running averages corresponds to the lowest number of unsatisfied checks and selects the corresponding number of local iterations as the limit on the number of local iterations that may be performed by data decoder circuit 350 on corresponding first global iterations. This selected limit on the number of global iterations is provided as a status output 382 to data decoder circuit 350.

The aforementioned process is then repeated for the second global iteration. In particular, the large number of data sets is processed through data processing circuit 300 with the number of local iterations through data decoder circuit 350 limited to the number identified in the previous processing. The number of local iterations allowed during the second global iterations is initially set at the default number (e.g., ten). At completion of each local iteration corresponding to the second global iteration, data decoder circuit 350 reports the number of remaining unsatisfied checks as a status output 358 to local iteration adjustment circuit 380. Local iteration adjustment circuit 380 monitors the number of unsatisfied checks remaining at the end of each local iteration occurring during the second global iteration through data decoder circuit 350. This monitoring is performed over a large number of data sets. Local iteration adjustment circuit 380 maintains a running average of the number of unsatisfied checks remaining at the end of each local iteration across the large number of data sets that are processed through data processing circuit 300. Thus, for example, where the default number of local iterations is ten, local iteration adjustment circuit 380 maintains: (a) a first running average of unsatisfied checks remaining after completion of the first local iteration through data decoder circuit 350, (b) a second running average of unsatisfied checks remaining after completion of the second local iteration through data decoder circuit 350, (c) a third running average of unsatisfied checks remaining after completion of the third local iteration through data decoder circuit 350, (d) a fourth running average of unsatisfied checks remaining after completion of the fourth local iteration through data decoder circuit 350, (e) a fifth running average of unsatisfied checks remaining after completion of the fifth local iteration through data decoder circuit 350, (f) a sixth running average of unsatisfied checks remaining after completion of the sixth local iteration through data decoder circuit 350, (g) a seventh running average of unsatisfied checks remaining after completion of the seventh local iteration through data decoder circuit 350, (h) an eighth running average of unsatisfied checks remaining after completion of the eighth local iteration through data decoder circuit 350, (i) a ninth running average of unsatisfied checks remaining after completion of the ninth local iteration through data decoder circuit 350, and (j) a tenth running average of unsatisfied checks remaining after completion of the tenth local iteration through data decoder circuit 350. Once a sufficient number of data sets have been processed through data processing circuit 300, local iteration adjustment circuit 380 determines which of the running averages corresponds to the lowest number of unsatisfied checks and selects the corresponding number of local iterations as the limit on the number of local iterations that may be performed by data decoder circuit 350 on corresponding second global iterations. This selected limit on the number of global iterations is provided as a status output 382 to data decoder circuit 350.

The aforementioned process may then be repeated for the third global iteration with the limit set for the first global iteration and the second global iteration enforced while determining an appropriate number of local iterations for the third global iterations. This process may be repeated for each possible global iteration, or may be limited to determining a number of local iterations for the first few global iterations and leaving the default number of local iterations for all subsequent global iterations. As an example, in one embodiment of the present invention the aforementioned process of limiting the number of local iterations is performed on the first three global iterations, and the fourth and higher global iterations use the default number of local iterations. Based upon the disclosure provided herein, one of ordinary skill in the art will recognize different numbers of global iterations to which local iteration limitation may be applied in accordance with different embodiments of the present invention.

Figure 4:
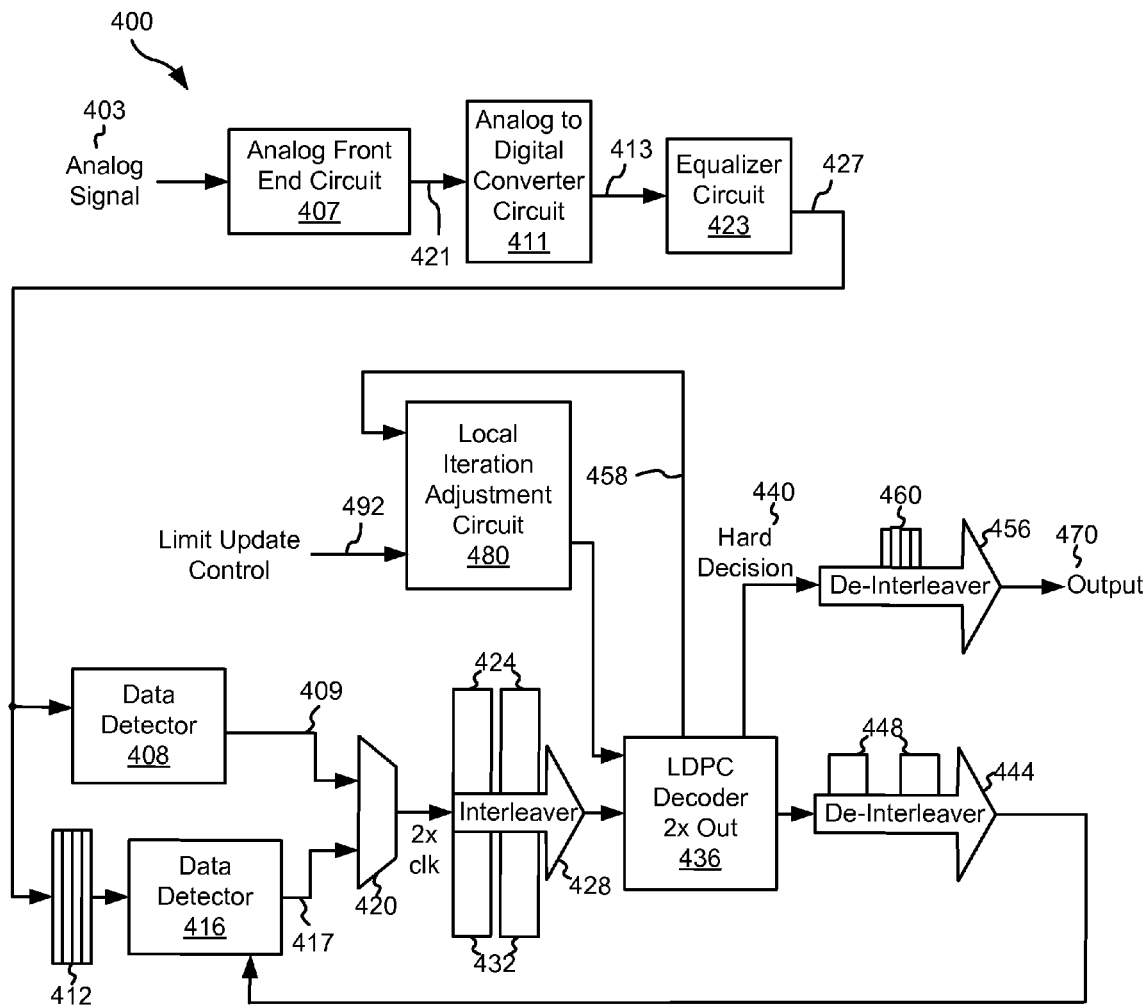
FIG. 4 depicts another data processing circuit having a local iteration adjustment circuit in accordance with some embodiments of the present invention.

Turning to FIG. 4, another data processing circuit 400 is shown that includes a local iteration adjustment circuit 480 in accordance with some embodiments of the present invention. Data processing circuit 400 includes an analog front end circuit 407 that receives an analog signal 403. Analog front end circuit 407 processes analog signal 403 and provides a processed analog signal 421 to an analog to digital converter circuit 411. Analog front end circuit 407 may include, but is not limited to, an analog filter and an amplifier circuit as are known in the art. Based upon the disclosure provided herein, one of ordinary skill in the art will recognize a variety of circuitry that may be included as part of analog front end circuit 407. In some cases, analog signal 403 is derived from a read/write head assembly (not shown) that is disposed in relation to a storage medium (not shown). In other cases, analog signal 403 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 403 may be derived.

Analog to digital converter circuit 411 converts processed analog signal 421 into a corresponding series of digital samples 413. Analog to digital converter circuit 411 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 413 are provided to an equalizer circuit 423. Equalizer circuit 423 applies an equalization algorithm to digital samples 413 to yield an equalized output 427. In some embodiments of the present invention, equalizer circuit 423 is a digital finite impulse response filter circuit as are known in the art.

Equalized output 427 is provided to both a data detector circuit 408 and to an input data buffer 412. Input data buffer 412 stores equalized output 427 as buffered data for use in subsequent iterations through another data detector circuit 416. Data detector circuit 408 may be any type of data detector circuit known in the art including, but not limited to, a soft output Viterbi algorithm detector (SOVA) or a maximum a posteriori (MAP) detector. Based on the disclosure provided herein, one of ordinary skill in the art will recognize a variety of data detector circuits that may be used in accordance with different embodiments of the present invention. Input data buffer 412 that is designed to hold a number of data sets received from as equalized output 427. The size of input data buffer 412 may be selected to provide sufficient buffering such that a data set input via equalized output 427 remains available at least until a first iteration processing of that same data set is complete and the processed data is available in a ping pong buffer 448 (i.e., a queuing buffer) as more fully described below. Input data buffer 412 provides the data sets to data detector circuit 416. Similar to data detector circuit 408, data detector circuit 416 may be any type of data detector circuit known in the art including, but not limited to, a SOVA detector or a MAP detector. Again, based on the disclosure provided herein, one of ordinary skill in the art will recognize a variety of data detector circuits that may be used in accordance with different embodiments of the present invention.

An output 409 from data detector circuit 408 and an output 417 from data detector circuit 416 are provided to an interleaver circuit 428 via a multiplexer 420. Such outputs may be, for example, log likelihood ratio values. Interleaver circuit 420 interleaves the output of data detector circuit 408 and separately interleaves the output of data detector circuit 416 using two ping pong buffers 424, 432. One of the buffers in ping pong buffer 424 holds the result of a prior interleaving process of the output from data detector circuit 408 and is unloaded to a low density parity check (LDPC) decoder 436, while the other buffer of ping pong buffer 424 holds a data set from data detector circuit 408 that is currently being interleaved. Similarly, one of the buffers in ping pong buffer 432 holds the result of a prior interleaving process of the output from data detector circuit 416 and is unloaded to LDPC decoder 436, while the other buffer of ping pong buffer 424 holds a data set from data detector circuit 416 that is currently being interleaved.

LDPC decoder 436 is capable of decoding one or more data sets simultaneously. As an example, LDPC decoder 436 may be designed to decode an interleaved data set from ping pong buffer 424, or an interleaved data set from ping pong buffer 432, or to decode interleaved data sets from ping pong buffer 424 and ping pong buffer 432 simultaneously. The decoded data is either provided as a hard decision output 440 and/or to a de-interleaver circuit 444 that uses ping pong buffer 448 to de-interleave the decoded data and to provide the de-interleaved data as an input to data detector circuit 416. One of the buffers in ping pong buffer 448 holds the result of a prior de-interleaving process and is unloaded to data detector circuit 416, while the other buffer of ping pong buffer 448 holds a decoded data set currently being de-interleaved. Hard decision output 440 is provided to a de-interleaver circuit 456 that de-interleaves hard decision output 440 and stores the de-interleaved result in an output data buffer 460. Ultimately, de-interleaver circuit 456 provides the de-interleaved data stored in output data buffer 460 as an output 470.

In operation, a first data set is introduced via data input 404 to data detector circuit 408. Data detector circuit 408 performs its channel detection algorithm and provides both a hard output and a soft output to multiplexer 420. The hard and soft decision data is written to one buffer of ping pong buffer 424. At the same time the detector output is written into the buffer, interleaver 428 interleaves the data set by writing consecutive data into non-consecutive memory/buffer addresses based on the interleaver algorithm/mapping. Once interleaver 424 completes its interleaving process, the interleaved data is decoded by LDPC decoder 436. Where the data converges, LDPC decoder 436 writes its output as hard decision output 440 to output data buffer 460 and the processing is completed for that particular data set. Alternatively, where the data does not converge, LDPC decoder 436 writes its output (both soft and hard) to ping pong buffer 448. As more fully described below, the scheduling guarantees that there is at least one empty buffer for holding this new set of data, and this strategy assures that each data input is guaranteed the possibility of at least two global iterations (i.e., two passes through a detector and decoder pair).

The data written to ping pong buffer 448 is fed back to data detector circuit 416. Data detector circuit 416 selects the data set that corresponds to the output in ping pong buffer 448 from input data buffer 412 and performs a subsequent data detection aided by the soft output data generated by LDPC decoder 436 fed back from ping pong buffer 448. By using the previously generated soft data for data maintained in input data buffer 412, data detector circuit 416 generally performs a subsequent channel detection with heightened accuracy. The output of this subsequent channel detection is passed to interleaver 428 via multiplexer 420. The data is written to one buffer of ping pong buffer 432, and interleaver 428 interleaves the data. The interleaved data is then passed to LDPC decoder 436 where it is decoded a second time. Similar to the first iteration, a decision is made as to whether the data converged or whether there is insufficient space in ping pong buffer 448 to handle the data. Where such is the case, LDPC decoder 436 writes its output as hard decision output 440 to output data buffer 460 and the processing is complete for that particular data set. Alternatively, where the data does not converge and there is sufficient buffer space in ping pong buffer 448 to receive an additional data set, writes its output (both soft and hard) to ping pong buffer 448 where it is passed back to data detector circuit 416 for a third pass. Sufficient space is defined in ping pong buffer 448 by having at least reserved space for the data set from the first detector and decoder after the data set from the second detector and decoder is written into the ping pong buffer.

It should be noted that, as an example, a first data set may be applied at data input 404 and that it takes a number of iterations to converge while all subsequent data sets applied at data input 404 converge on the first pass (i.e., on a single global iteration). In such a case, the first data set may be processed a number of times (i.e., a number of global iterations) that is limited by the amount of memory available in output data buffer 460. Once output data buffer 460 is full or once an ordered set of outputs are available, the most recent hard decision output corresponding to the first data set is provided as a hard decision output and de-interleaver 456 re-orders the outputs putting the first output in the first position. With this done, output data buffer 460 are flushed out as output 470. In some embodiments of the present invention, de-interleaver 456 does not perform a re-ordering function and output data buffer 460 has a very limited size. In such a case, it is conceivable that a data set could be processed a very large number times (i.e., a large number of global iterations) only limited by how long a recipient of output 470 is willing to wait for the data. As another example, it is possible that all data applied as equalized output 427 converges on its first pass. In such a case, data detector circuit 416, LDPC decoder 436 and/or de-interleaver 444 may be placed in a power saving mode to conserve power. As yet another example, it may be the case that all data sets applied as equalized output 427 fail to converge on the first pass (i.e., a single global iteration). In such a case, all data sets would be iterated twice. It should also be noted that one or more additional data detector circuits may be added along with additional space in ping pong buffers 424, 432, 448 that would facilitate more iterations in the situation where a significant number of closely located data sets fail to converge. In such cases, all data sets can be guaranteed to be decoded with number of iterations the same as the number of detectors.

During each global iteration it is possible for data decoder circuit 436 to make one or more local iterations including application of the data decoding algorithm to the previously data decoding result. For the first local iteration, data decoder circuit 436 applies the data decoder algorithm without guidance from a previous decoded output. For subsequent local iterations, data decoder circuit 436 applies the data decoding algorithm to a detected output received from one of ping pong buffers 424, 432 as guided by a previous decoded output. The number of local iterations allowed is controlled by local iteration adjustment circuit 480. In some embodiment of the present invention, a default of ten local iterations is allowed for each global iteration. This default number of local iterations may be changed by local iteration adjustment circuit 480 based upon information from previous data processing in an attempt to improve the ability for the data decoding algorithm to converge and/or for power saving purposes.

In particular, when a limit update control input 492 is asserted, local iteration limit circuit 480 initially sets the allowable number of local iterations to the default number (e.g., ten). Limit update control input 492 may be asserted by a user programmable input. In other cases, limit update control input 492 may be asserted based upon a degradation in operation of data processing circuit 400. Based upon the disclosure provided herein, one of ordinary skill in the art will recognize a variety of approaches that may be used to determine when to assert limit update control input 492. Where limit update control input 492 is not asserted, the local iteration limits set during previous monitoring are used.

At completion of each local iteration, data decoder circuit 436 reports the number of remaining unsatisfied checks as a status output 458 to local iteration adjustment circuit 480. Local iteration adjustment circuit 480 monitors the number of unsatisfied checks remaining at the end of each local iteration occurring during the first global iteration through data decoder circuit 436. This monitoring is performed over a large number of data sets. In some embodiments, the monitoring continues for several thousand sectors of data. Local iteration adjustment circuit 480 maintains a running average of the number of unsatisfied checks remaining at the end of each local iteration across the large number of data sets that are processed through data processing circuit 400. Thus, for example, where the default number of local iterations is ten, local iteration adjustment circuit 480 maintains: (a) a first running average of unsatisfied checks remaining after completion of the first local iteration through data decoder circuit 436, (b) a second running average of unsatisfied checks remaining after completion of the second local iteration through data decoder circuit 436, (c) a third running average of unsatisfied checks remaining after completion of the third local iteration through data decoder circuit 436, (d) a fourth running average of unsatisfied checks remaining after completion of the fourth local iteration through data decoder circuit 436, (e) a fifth running average of unsatisfied checks remaining after completion of the fifth local iteration through data decoder circuit 436, (f) a sixth running average of unsatisfied checks remaining after completion of the sixth local iteration through data decoder circuit 436, (g) a seventh running average of unsatisfied checks remaining after completion of the seventh local iteration through data decoder circuit 436, (h) an eighth running average of unsatisfied checks remaining after completion of the eighth local iteration through data decoder circuit 436, (i) a ninth running average of unsatisfied checks remaining after completion of the ninth local iteration through data decoder circuit 436, and (j) a tenth running average of unsatisfied checks remaining after completion of the tenth local iteration through data decoder circuit 436. Once a sufficient number of data sets have been processed through data processing circuit 400, local iteration adjustment circuit 480 determines which of the running averages corresponds to the lowest number of unsatisfied checks and selects the corresponding number of local iterations as the limit on the number of local iterations that may be performed by data decoder circuit 436 on corresponding first global iterations. This selected limit on the number of global iterations is provided as a status output 482 to data decoder circuit 436.

The aforementioned process is then repeated for the second global iteration. In particular, the large number of data sets is processed through data processing circuit 400 with the number of local iterations through data decoder circuit 436 limited to the number identified in the previous processing. The number of local iterations allowed during the second global iterations is initially set at the default number (e.g., ten). At completion of each local iteration corresponding to the second global iteration, data decoder circuit 436 reports the number of remaining unsatisfied checks as a status output 458 to local iteration adjustment circuit 480. Local iteration adjustment circuit 480 monitors the number of unsatisfied checks remaining at the end of each local iteration occurring during the second global iteration through data decoder circuit 436. This monitoring is performed over a large number of data sets. Local iteration adjustment circuit 480 maintains a running average of the number of unsatisfied checks remaining at the end of each local iteration across the large number of data sets that are processed through data processing circuit 400. Thus, for example, where the default number of local iterations is ten, local iteration adjustment circuit 480 maintains: (a) a first running average of unsatisfied checks remaining after completion of the first local iteration through data decoder circuit 436, (b) a second running average of unsatisfied checks remaining after completion of the second local iteration through data decoder circuit 436, (c) a third running average of unsatisfied checks remaining after completion of the third local iteration through data decoder circuit 436, (d) a fourth running average of unsatisfied checks remaining after completion of the fourth local iteration through data decoder circuit 436, (e) a fifth running average of unsatisfied checks remaining after completion of the fifth local iteration through data decoder circuit 436, (f) a sixth running average of unsatisfied checks remaining after completion of the sixth local iteration through data decoder circuit 436, (g) a seventh running average of unsatisfied checks remaining after completion of the seventh local iteration through data decoder circuit 436, (h) an eighth running average of unsatisfied checks remaining after completion of the eighth local iteration through data decoder circuit 436, (i) a ninth running average of unsatisfied checks remaining after completion of the ninth local iteration through data decoder circuit 436, and (j) a tenth running average of unsatisfied checks remaining after completion of the tenth local iteration through data decoder circuit 436. Once a sufficient number of data sets have been processed through data processing circuit 400, local iteration adjustment circuit 480 determines which of the running averages corresponds to the lowest number of unsatisfied checks and selects the corresponding number of local iterations as the limit on the number of local iterations that may be performed by data decoder circuit 436 on corresponding second global iterations. This selected limit on the number of global iterations is provided as a status output 482 to data decoder circuit 436.

The aforementioned process may then be repeated for the third global iteration with the limit set for the first global iteration and the second global iteration enforced while determining an appropriate number of local iterations for the third global iterations. This process may be repeated for each possible global iteration, or may be limited to determining a number of local iterations for the first few global iterations and leaving the default number of local iterations for all subsequent global iterations. As an example, in one embodiment of the present invention the aforementioned process of limiting the number of local iterations is performed on the first three global iterations, and the fourth and higher global iterations use the default number of local iterations. Based upon the disclosure provided herein, one of ordinary skill in the art will recognize different numbers of global iterations to which local iteration limitation may be applied in accordance with different embodiments of the present invention.

It should be noted that local iteration adjustment circuitry in accordance with different embodiments of the present invention may be applied to a variety of different data processing circuits. For example, such local iteration adjustment circuitry may be applied to data processing circuits such as those described in U.S. patent application Ser. No. 12/114,462 entitled "Systems and Methods for Queue Based Data Detection and Decoding" and filed May 2, 2008 by Yang et al. The entirety of the aforementioned reference is incorporated herein by reference for all purposes. As another example, such power monitoring and/or power governance may be applied to data processing circuits such as those described in U.S. patent application Ser. No. 12/785,416 entitled "Systems and Methods for Variable Data Processing Using a Central Queue" and filed May 21, 2010 by Gunnam et al. The entirety of the aforementioned reference is incorporated herein by reference for all purposes. Based upon the disclosure provided herein, one of ordinary skill in the art will recognize a variety of other data processing circuits that may be used in relation to different embodiments of the present invention.

Figure 5A:
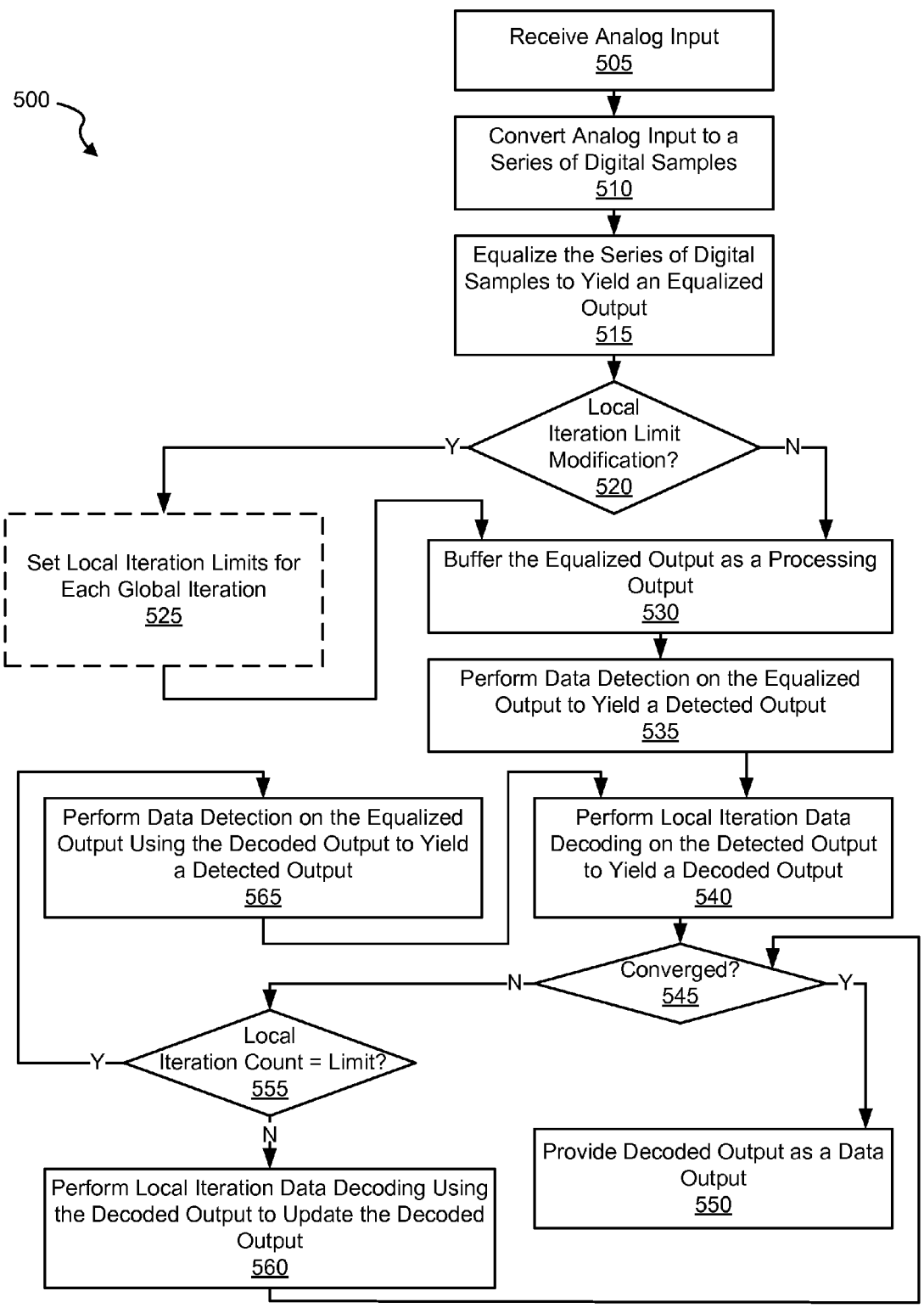
FIGS. 5a-5b are flow diagrams showing a method in accordance with some embodiments of the present invention for adjusting the number of local data decode iterations performed during data processing.
Figure 5B:
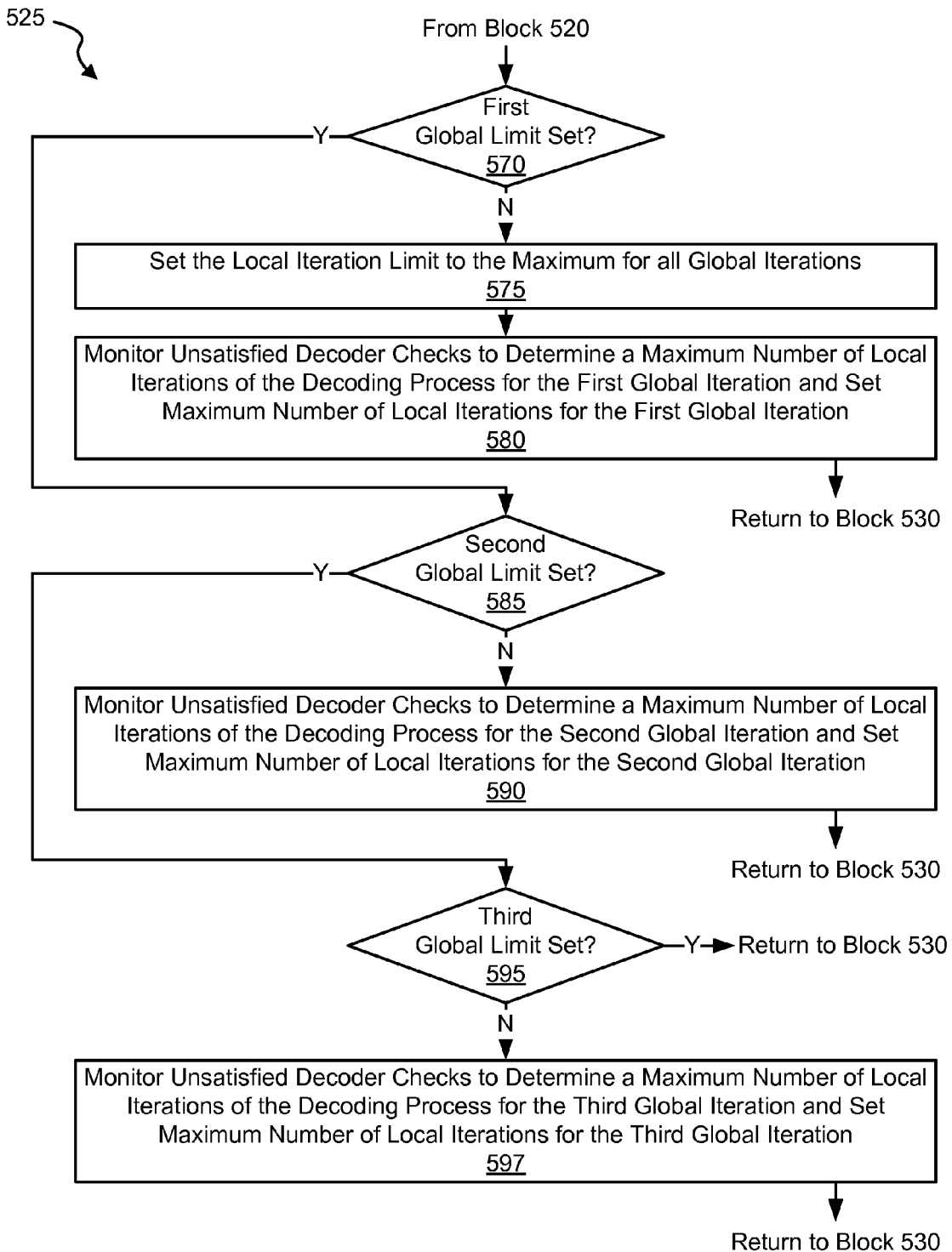

Turning to FIGS. 5a-5b, a flow diagrams 500 shows a method in accordance with some embodiments of the present invention for adjusting the number of local data decode iterations performed during data processing. Turning to FIG. 5a and following flow diagram 500, an analog input is received (block 505). The analog input may be derived from, for example, a storage medium or a data transmission channel. Based upon the disclosure provided herein, one of ordinary skill in the art will recognize a variety of sources of the analog input. The analog input is converted to a series of digital samples (block 510). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (Y[k]) (block 515). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. Of note, the equalized output may include both electronic noise and media noise.

It is determined whether local iteration limit modification is desired (block 520). This may include, for example, determining whether the data processing circuit subject to the local iteration limit processing is being initialized, whether a user request to update local iteration limits has been received, and/or whether operation of the data processing circuit subject to the local iteration limit processing has degraded to a point that re-characterization is desired. Based upon the disclosure provided herein, one of ordinary skill in the art will recognize a variety of mechanisms that may cause such processing.

Where local iteration limit modification is not desired (block 520), data processing is performed using existing limits on the number of local iterations through a data decoder process. In some cases, the number of local iterations is a default number for all global iterations (e.g., ten). In other cases, the number of local iterations is limited to that number that was set during a local limitation setting process described below in relation to block 525. The data processing includes applying a data detection algorithm on the equalized output to yield a detected output (block 535). As just two examples, the data detection algorithm may be a maximum a posteriori data detection algorithm or a Viterbi algorithm detection as are known in the art. Based upon the disclosure provided herein, one of ordinary skill in the art will recognize a variety of data detection algorithms that may be used in relation to different embodiments of the present invention. The detected output includes both hard decisions and soft decisions.

A first local iteration of a data decoding algorithm is applied to the detected output to yield a decoded output (block 540). As just two examples, the data decode algorithm may be a low density parity check decode algorithm or a Reed Solomon decode algorithm as are known in the art. Based upon the disclosure provided herein, one of ordinary skill in the art will recognize a variety of data decode algorithms that may be used in relation to different embodiments of the present invention. It is determined whether the first local iteration resulted in obtaining the originally written data (i.e., the data decoding algorithm converged) (block 545). Where the data decoding algorithm converged (block 545), the resulting decoded output is provided as a data output (block 550).

Alternatively, where the data decoding algorithm failed to converge (i.e., there are remaining unsatisfied checks) (block 545), it is determined whether the number of local iterations has been exceeded for this particular global iteration (block

555). Where the number of local iterations has not yet been exceeded (block 555), another local iteration of the data decoding algorithm is applied to the detected output using the previous decoded output to yield an updated decoded output (block 560). In addition, the number of local iterations is incremented. The process of determining whether the decoding algorithm converged (block 545), providing a data output (block 560), determining if the number of local iterations has been exceeded (block 555) is repeated. Alternatively, where the number of local iterations has been exceeded (block 555), the data detection algorithm is applied to the equalized output using the most current decoded output as a guide to yield an updated detected output (block 565). At this juncture, the processes of blocks 540, 545, 550, 555, 560, 565 is repeated for a subsequent global iteration. Of note, the number of local iterations allowed for the subsequent global iteration may be different from that for other global iterations or the same as that for other global iterations.

Alternatively, where local iteration limit modification is desired (block 520), processing is performed to set local iteration limits for each global iteration (block 525). Turning to FIG. 5b, a flow diagram shows the process of setting the number of allowable local iterations. In particular, it is determined whether a limit on the number of local iterations has been set for the first global iteration (block 570). If a limit on the number of local iterations has not yet been set for the first global iteration (block 570), the number of local iterations allowed for each global iteration are set to the maximum (block 575). The number of unsatisfied checks for each local iteration are monitored and a limit for the maximum number of local iterations allowable for the first global iteration is set (block 580). The monitoring is performed over a large number of data sets. The process of determining the limit to the number of local iterations includes maintaining a running average of the number of unsatisfied checks remaining at the end of each local iteration across the large number of data sets. Thus, for example, where the default number of local iterations is ten, a local iteration adjustment circuit maintains: (a) a first running average of unsatisfied checks remaining after completion of the first local iteration through the data decoder algorithm, (b) a second running average of unsatisfied checks remaining after completion of the second local iteration through the data decoder algorithm, (c) a third running average of unsatisfied checks remaining after completion of the third local iteration through the data decoder algorithm, (d) a fourth running average of unsatisfied checks remaining after completion of the fourth local iteration through the data decoder algorithm, (e) a fifth running average of unsatisfied checks remaining after completion of the fifth local iteration through the data decoder algorithm, (f) a sixth running average of unsatisfied checks remaining after completion of the sixth local iteration through the data decoder algorithm, (g) a seventh running average of unsatisfied checks remaining after completion of the seventh local iteration through the data decoder algorithm, (h) an eighth running average of unsatisfied checks remaining after completion of the eighth local iteration through the data decoder algorithm, (i) a ninth running average of unsatisfied checks remaining after completion of the ninth local iteration through the data decoder algorithm, and (j) a tenth running average of unsatisfied checks remaining after completion of the tenth local iteration through the data decoder algorithm. Once a sufficient number of data sets have been processed through the data processing, the local iteration adjustment circuit determines which of the running averages corresponds to the lowest number of unsatisfied checks and selects the corresponding number of local iterations as the limit on the number of local iterations that may be performed by the data decoding algorithm on corresponding first global iterations. At this juncture, processing returns to block 530.

Alternatively, where it is determined that the number of local iterations has been set for the first global iteration (block 570), it is determined whether a limit on the number of local iterations has been set for the second global iteration (block 585), the number of unsatisfied checks for each local iteration corresponding to a second global iteration are monitored and a limit for the maximum number of local iterations allowable for the second global iteration is set (block 590). The monitoring is performed over a large number of data sets with the number of local iterations for the first global iteration limit set in block 580 being enforced. The process of determining the limit to the number of local iterations includes maintaining a running average of the number of unsatisfied checks remaining at the end of each local iteration across the large number of data sets. Thus, for example, where the default number of local iterations is ten, a local iteration adjustment circuit maintains: (a) a first running average of unsatisfied checks remaining after completion of the first local iteration through the data decoder algorithm, (b) a second running average of unsatisfied checks remaining after completion of the second local iteration through the data decoder algorithm, (c) a third running average of unsatisfied checks remaining after completion of the third local iteration through the data decoder algorithm, (d) a fourth running average of unsatisfied checks remaining after completion of the fourth local iteration through the data decoder algorithm, (e) a fifth running average of unsatisfied checks remaining after completion of the fifth local iteration through the data decoder algorithm, (f) a sixth running average of unsatisfied checks remaining after completion of the sixth local iteration through the data decoder algorithm, (g) a seventh running average of unsatisfied checks remaining after completion of the seventh local iteration through the data decoder algorithm, (h) an eighth running average of unsatisfied checks remaining after completion of the eighth local iteration through the data decoder algorithm, (i) a ninth running average of unsatisfied checks remaining after completion of the ninth local iteration through the data decoder algorithm, and (j) a tenth running average of unsatisfied checks remaining after completion of the tenth local iteration through the data decoder algorithm. Once a sufficient number of data sets have been processed through the data processing, the local iteration adjustment circuit determines which of the running averages corresponds to the lowest number of unsatisfied checks and selects the corresponding number of local iterations as the limit on the number of local iterations that may be performed by the data decoding algorithm on corresponding second global iterations. At this juncture, processing returns to block 530.

Alternatively, where it is determined that the number of local iterations has been set for the second global iteration (block 585), it is determined whether a limit on the number of local iterations has been set for the second global iteration (block 595), the number of unsatisfied checks for each local iteration corresponding to a third global iteration are monitored and a limit for the maximum number of local iterations allowable for the third global iteration is set (block 597). The monitoring is performed over a large number of data sets with the number of local iterations for the first global iteration limit set in block 580 and the number of local iterations for the second global iteration limit set in block 590 being enforced. The process of determining the limit to the number of local iterations includes maintaining a running average of the number of unsatisfied checks remaining at the end of each local iteration across the large number of data sets. Thus, for example, where the default number of local iterations is ten, a local iteration adjustment circuit maintains: (a) a first running average of unsatisfied checks remaining after completion of the first local iteration through the data decoder algorithm, (b) a second running average of unsatisfied checks remaining after completion of the second local iteration through the data decoder algorithm, (c) a third running average of unsatisfied checks remaining after completion of the third local iteration through the data decoder algorithm, (d) a fourth running average of unsatisfied checks remaining after completion of the fourth local iteration through the data decoder algorithm, (e) a fifth running average of unsatisfied checks remaining after completion of the fifth local iteration through the data decoder algorithm, (f) a sixth running average of unsatisfied checks remaining after completion of the sixth local iteration through the data decoder algorithm, (g) a seventh running average of unsatisfied checks remaining after completion of the seventh local iteration through the data decoder algorithm, (h) an eighth running average of unsatisfied checks remaining after completion of the eighth local iteration through the data decoder algorithm, (i) a ninth running average of unsatisfied checks remaining after completion of the ninth local iteration through the data decoder algorithm, and (j) a tenth running average of unsatisfied checks remaining after completion of the tenth local iteration through the data decoder algorithm. Once a sufficient number of data sets have been processed through the data processing, the local iteration adjustment circuit determines which of the running averages corresponds to the lowest number of unsatisfied checks and selects the corresponding number of local iterations as the limit on the number of local iterations that may be performed by the data decoding algorithm on corresponding third global iterations. At this juncture, processing returns to block 530. Limits on the number of local iterations for the fourth and higher global iterations is not set, and thus the process is returned to block 530 where limits have been previously set for each of the first, second and third global iterations. Of note, the process may be performed to set limits for less than or more than three global iterations.

Figure 6:
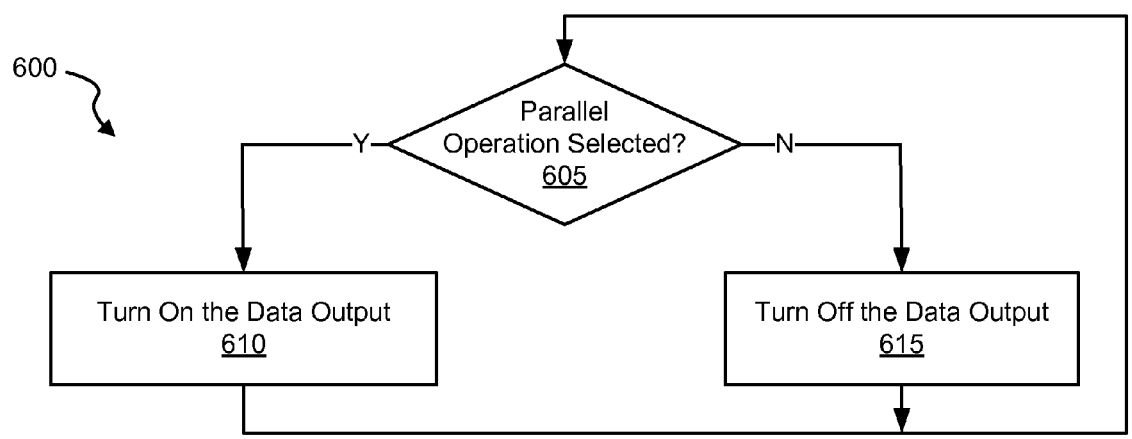
FIG. 6 is a flow diagram shows a method in accordance with one or more embodiments of the present invention for selecting modification of the number of local data decode iterations either in parallel or as a stand alone process.

Turning to FIG. 6, a flow diagram 600 shows a method in accordance with one or more embodiments of the present invention for selecting whether modification of the number of local data decode iterations is done in parallel or as a stand alone process. Following flow diagram 600, it is determined whether parallel operation is to be performed (block 605). Parallel operation is done while normal data processing is performed that includes providing a data output. Non-parallel operation uses the same data, but does not allow a data output during processing to establish limits on the number of local iterations. Where parallel operation is selected (block 605), the data output is turned on (block 610). Alternatively, where parallel operation is not selected (block 605), the data output is turned on (block 615).

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing circuit, the data processing circuit comprising:
    a data decoder circuit operable to perform a number of local iterations on a decoder input to yield a data output;
    a local iteration adjustment circuit operable to generate a limit on the number of local iterations performed by the data decoder circuit;
    a data detector circuit operable to apply a data detection algorithm to a received input to yield the decoder input, wherein processing through both the data detector circuit and the data decoder circuit is a global iteration; and
    wherein the data detector circuit and the data decoder circuit are operable to apply:
        a first global iteration the received input;
        a second global iteration to the received input;
        wherein the limit on the number of local iterations performed by the data decoder circuit is a first limit corresponding to the first global iteration; and
        wherein the local iteration adjustment circuit is further operable to generate a second limit on the number of local iterations performed by the data decoder circuit corresponding to the second global iteration.

2. The data processing circuit of claim 1, wherein the data detector circuit is selected from a group consisting of: a maximum a posteriori data detector circuit, and a Viterbi algorithm data detector circuit.

3. The data processing circuit of claim 1, wherein the local iteration adjustment circuit is further operable to:
    receive a first status signal from the data decoder circuit indicating a first number of unsatisfied checks remaining at the end of a first local iteration during the first global iteration;
    receive a second status signal from the data decoder circuit indicating a second number of unsatisfied checks remaining at the end of a second local iteration during the first global iteration;
    incorporate the first number of unsatisfied checks in a first average of unsatisfied checks corresponding to the first local iteration during the first global iteration; and
    incorporate the second number of unsatisfied checks in a second average of unsatisfied checks corresponding to the second local iteration during the first global iteration.

4. The data processing circuit of claim 3, wherein the local iteration adjustment circuit is further operable to:
    determine that the second average of unsatisfied checks is less than the first average of unsatisfied checks; and
    based at least in part on determining that the second average of unsatisfied checks is less than the first average of unsatisfied checks, selecting the local iteration corresponding to the second local iteration as the limit on the number of local iterations during the first global iteration.

5. The data processing circuit of claim 4, wherein the local iteration adjustment circuit is further operable to:
- receive a third status signal from the data decoder circuit indicating a third number of unsatisfied checks remaining at the end of a third local iteration during the second global iteration;
- receive a fourth status signal from the data decoder circuit indicating a fourth number of unsatisfied checks remaining at the end of a fourth local iteration during the second global iteration;
- incorporate the third number of unsatisfied checks in a third average of unsatisfied checks corresponding to the third local iteration during the second global iteration; and
- incorporate the fourth number of unsatisfied checks in a fourth average of unsatisfied checks corresponding to the fourth local iteration during the second global iteration.

6. The data processing circuit of claim 5, wherein the local iteration adjustment circuit is further operable to:
- determine that the fourth average of unsatisfied checks is less than the third average of unsatisfied checks; and
- based at least in part on determining that the fourth average of unsatisfied checks is less than the third average of unsatisfied checks, selecting the local iteration corresponding to the fourth local iteration as the limit on the number of local iterations during the second global iteration.

7. The data processing circuit of claim 1, wherein the data processing circuit further comprises:
- an equalizer circuit operable to receive a series of digital samples and to equalize the series of digital samples to yield the received input.

8. The data processing circuit of claim 7, wherein the data processing circuit further comprises:
- an analog to digital converter circuit operable to convert an analog input into the series of digital samples.

9. The data processing circuit of claim 1, wherein the data processing circuit is implemented as part of a device selected from a group consisting of: a storage device and a receiving device.

10. The data processing circuit of claim 1, wherein the data processing circuit is implemented as part of an integrated circuit.

11. The data processing circuit of claim 1, wherein the local iteration adjustment circuit is operable to:
- receive a first status signal from the data decoder circuit indicating a first number of unsatisfied checks remaining at the end of a first local iteration;
- receive a second status signal from the data decoder circuit indicating a second number of unsatisfied checks remaining at the end of a second local iteration;
- incorporate the first number of unsatisfied checks in a first average of unsatisfied checks corresponding to the first local iteration; and
- incorporate the second number of unsatisfied checks in a second average of unsatisfied checks corresponding to the second local iteration.

12. The data processing circuit of claim 11, wherein the local iteration adjustment circuit is further operable to:
- determine that the second average of unsatisfied checks is less than the first average of unsatisfied checks; and
- based at least in part on determining that the second average of unsatisfied checks is less than the first average of unsatisfied checks, selecting the local iteration corresponding to the second local iteration as the limit on the number of local iterations.

13. The data processing circuit of claim 1, wherein the data decoder circuit is selected from a group consisting of: a Reed Solomon data decoder circuit, and a low density parity check decoder circuit.

14. A method, the method comprising:
- receiving a data input;
- applying a data detection algorithm to the data input to yield a detected output;
- applying a data decoding algorithm to the detected output to yield a decoded output, wherein applying both the data detection algorithm and the data decoding algorithm is a global iteration, wherein the data decoding algorithm is applied multiple times during each global iteration, and wherein each application of the decoding algorithm is a local iteration;
- determining a first number of unsatisfied checks remaining at the end of a first local iteration;
- determining a second number of unsatisfied checks remaining at the end of a second local iteration;
- incorporating the first number of unsatisfied checks in a first average of unsatisfied checks corresponding to the first local iteration;
- incorporating the second number of unsatisfied checks in a second average of unsatisfied checks corresponding to the second local iteration;
- determining that the second average of unsatisfied checks is less than the first average of unsatisfied checks; and
- based at least in part on determining that the second average of unsatisfied checks is less than the first average of unsatisfied checks, selecting the local iteration corresponding to the second local iteration as the limit on the number of local iterations.

15. The method of claim 14, wherein the first local iteration and the second local iteration occur during a first global iteration, the method further comprising:
- limiting the number of local iterations during subsequent first global iterations to the limit on the number of local iterations;
- determining a third number of unsatisfied checks remaining at the end of a third local iteration during a second global iteration;
- determining a fourth number of unsatisfied checks remaining at the end of a fourth local iteration during a second global iteration;
- incorporating the third number of unsatisfied checks in a third average of unsatisfied checks corresponding to the third local iteration;
- incorporating the fourth number of unsatisfied checks in a fourth average of unsatisfied checks corresponding to the fourth local iteration;
- determining that the fourth average of unsatisfied checks is less than the third average of unsatisfied checks; and
- based at least in part on determining that the fourth average of unsatisfied checks is less than the third average of unsatisfied checks, selecting the local iteration corresponding to the fourth local iteration as the limit on the number of local iterations during subsequent second global iterations.

16. The method of claim 14, wherein the data decoding algorithm is selected from a group consisting of: a Reed Solomon data decoder algorithm, and a low density parity check decoder algorithm.

17. The method of claim 14, wherein the data detection algorithm is selected from a group consisting of: a maximum a posteriori data detector algorithm, and a Viterbi algorithm data detection algorithm.

18. A storage device, the storage device comprising:
a storage medium;
a head assembly disposed in relation to the storage medium and operable to provide a sensed signal corresponding to information on the storage medium;
a read channel circuit including:
   an analog processing circuit operable to provide an analog signal corresponding to the sensed signal;
   an analog to digital converter circuit operable to sample the analog signal to yield a series of digital samples;
   an equalizer circuit operable to equalize the digital samples to yield a received input;
   a data detector circuit operable to apply a data detection algorithm to the received input to yield a decoder input;
   a data decoder circuit operable to perform a number of local iterations on the decoder input to yield a data output;
   wherein processing through both the data detector circuit and the data decoder circuit is a global iteration; and
   a local iteration adjustment circuit operable to generate a limit on the number of local iterations performed by the data decoder circuit;
   wherein the data detector circuit and the data decoder circuit are operable to apply:
      a first global iteration the received input;
      a second global iteration to the received input;
      wherein the limit on the number of local iterations performed by the data decoder circuit is a first limit corresponding to the first global iteration; and
      wherein the local iteration adjustment circuit is further operable to generate a second limit on the number of local iterations performed by the data decoder circuit corresponding to the second global iteration, wherein the first limit is different from the second limit.

19. The storage device of claim 18, wherein the local iteration adjustment circuit is further operable to:
   receive a first status signal from the data decoder circuit indicating a first number of unsatisfied checks remaining at the end of a first local iteration during the first global iteration;
   receive a second status signal from the data decoder circuit indicating a second number of unsatisfied checks remaining at the end of a second local iteration during the first global iteration;
   incorporate the first number of unsatisfied checks in a first average of unsatisfied checks corresponding to the first local iteration during the first global iteration; and
   incorporate the second number of unsatisfied checks in a second average of unsatisfied checks corresponding to the second local iteration during the first global iteration.

20. The storage device of claim 19, wherein the local iteration adjustment circuit is further operable to:
   determine that the second average of unsatisfied checks is less than the first average of unsatisfied checks; and
   based at least in part on determining that the second average of unsatisfied checks is less than the first average of unsatisfied checks, selecting the local iteration corresponding to the second local iteration as the limit on the number of local iterations during the first global iteration.

* * * * *